(12) United States Patent
Sekiya (10) Patent No.: US 7,825,009 B2
(45) Date of Patent: Nov. 2, 2010

(54) MANUFACTURING METHOD FOR DEVICES

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 155 days.

(21) Appl. No.: 12/038,280

(22) Filed: Feb. 27, 2008

(65) Prior Publication Data

US 2008/0233711 A1  Sep. 25, 2008

(30) Foreign Application Priority Data

Mar. 19, 2007  (JP)  .............................. 2007-070000

(51) Int. Cl.
*H01L 21/00* (2006.01)
(52) U.S. Cl. .................. 438/463; 438/113; 438/464; 257/E21.599
(58) Field of Classification Search .................. 438/463, 438/113
See application file for complete search history.

(56) References Cited

U.S. PATENT DOCUMENTS

| | | | | |
|---|---|---|---|---|
| 5,110,388 A | * | 5/1992 | Komiyama et al. | 156/229 |
| 5,118,567 A | * | 6/1992 | Komiyama et al. | 428/345 |
| 5,316,853 A | * | 5/1994 | Shibata et al. | 428/416 |
| 5,411,921 A | * | 5/1995 | Negoro | 438/118 |
| 5,824,177 A | * | 10/1998 | Yoshihara et al. | 156/250 |
| 5,882,956 A | * | 3/1999 | Umehara et al. | 438/114 |
| 6,074,896 A | * | 6/2000 | Dando | 438/114 |
| 6,702,910 B2 | * | 3/2004 | Noguchi et al. | 156/85 |
| 6,806,544 B2 | * | 10/2004 | Liu | 257/414 |
| 6,908,784 B1 | * | 6/2005 | Farnworth et al. | 438/106 |
| 6,946,326 B2 | * | 9/2005 | Spooner et al. | 438/113 |
| 7,157,353 B2 | * | 1/2007 | Farnworth et al. | 438/462 |
| 7,223,320 B2 | * | 5/2007 | Arneson et al. | 156/344 |
| 7,354,802 B1 | * | 4/2008 | Poddar et al. | 438/113 |
| 7,410,831 B2 | * | 8/2008 | Sakaya et al. | 438/113 |
| 7,517,724 B2 | * | 4/2009 | Hatakeyama et al. | 438/114 |
| 7,550,367 B2 | * | 6/2009 | Tamura et al. | 438/463 |
| 7,563,642 B2 | * | 7/2009 | Higashino | 438/113 |
| 7,579,260 B2 | * | 8/2009 | Nakamura | 438/464 |
| 7,602,071 B2 | * | 10/2009 | Ohmiya et al. | 257/787 |
| 7,696,014 B2 | * | 4/2010 | Kitahara et al. | 438/118 |
| 2009/0134512 A1 | * | 5/2009 | Chiang et al. | 257/723 |

FOREIGN PATENT DOCUMENTS

JP  A 2000-182995  6/2000

\* cited by examiner

*Primary Examiner*—David A Zarneke
(74) *Attorney, Agent, or Firm*—Greer, Burns & Crain, Ltd.

(57) ABSTRACT

A manufacturing method for devices including a wafer supporting step of mounting an adhesive film to the lower surface of a wafer and attaching the wafer through the adhesive film to the upper surface of a dicing tape mounted on an annular frame, a laser processing step of applying a pulsed laser beam having an absorption wavelength to the wafer along separation lines formed on the upper surface of the wafer after mounting the adhesive film to the dicing tape, thereby separating the wafer into the individual devices and cutting the adhesive film, and a pickup step of expanding the dicing tape after performing the laser processing step to thereby increase the spacing between any adjacent ones of the individual devices, and peeling off to pick up each of the individual devices from the dicing tape in the condition where the adhesive film is mounted on the lower surface of each device.

5 Claims, 9 Drawing Sheets

MANUFACTURING METHOD FOR DEVICES

BACKGROUND OF THE INVENTION

1. Field of the Invention

The present invention relates to a manufacturing method for devices formed in a plurality of partitioned regions defined by a plurality of crossing separation lines formed on the upper surface of a wafer, wherein the wafer is separated into the individual devices along the separation lines and an adhesive film for die bonding is mounted on the lower surface of each device.

2. Description of the Related Art

In a semiconductor device fabrication process, the upper surface of a substantially disk-shaped semiconductor wafer is formed with a plurality of crossing streets (separation lines) to thereby define a plurality of partitioned regions arranged like a matrix, and a plurality of devices such as ICs and LSIs are formed in these partitioned regions. The semiconductor wafer is cut along these separation lines to separate the partitioned regions, thus fabricating the individual devices. As a separating device for separating the semiconductor wafer into the individual devices, a cutting unit called a dicing unit is generally used. The cutting unit includes a cutting blade having a thickness of about 40 μm for cutting the semiconductor wafer along the separation lines. The separated devices thus obtained are packaged to be widely used in electronic equipment such as a mobile phone and a personal computer.

An adhesive film for die bonding called a die attach film is mounted on the lower surface of each device. The adhesive film is formed of epoxy resin or the like and has a thickness of 70 to 80 μm. Each device is bonded through the adhesive film to a die bonding frame by heating, so that each device is supported to the die bonding frame. As a method of mounting the adhesive film to the lower surface of each device, the following method is known in the art. First, an original adhesive film is attached to the lower surface of a semiconductor wafer. Thereafter, the semiconductor wafer is attached through this adhesive film to a dicing tape. Thereafter, both the semiconductor wafer and the adhesive film attached thereto are cut along the separation lines formed on the upper surface of the semiconductor wafer by using a cutting blade, thereby forming the individual separated devices in the condition where the adhesive film is mounted on the lower surface of each device (see Japanese Patent Laid-Open No. 2000-182995, for example).

However, in the case that the thickness of the wafer becomes less than or equal to 100 μm, the separated devices obtained by cutting the wafer with the adhesive film mounted on the lower surface thereof by means of the cutting blade may be vibrated on the adhesive film, so that the devices may be damaged by the impact of the cutting blade rotating at a high speed.

SUMMARY OF THE INVENTION

It is therefore an object of the present invention to provide a manufacturing method for devices wherein even when the thickness of a wafer is less than or equal to 100 μm, the individual separated devices can be manufactured without any damage thereto in the condition where an adhesive film is mounted on the lower surface of each device.

In accordance with an aspect of the present invention, there is provided a manufacturing method for devices formed in a plurality of partitioned regions defined by a plurality of crossing separation lines formed on the upper surface of a wafer having a thickness of less than or equal to 100 μm, wherein the wafer is being separated into the individual devices along the separation lines, the manufacturing method including a wafer supporting step of mounting an adhesive film for die bonding to the lower surface of the wafer and attaching the wafer through the adhesive film to the upper surface of a dicing tape mounted on an annular frame; a laser processing step of applying a pulsed laser beam having an absorption wavelength to the wafer along the separation lines of the wafer after mounting the adhesive film to the dicing tape, thereby separating the wafer into the individual devices and cutting the adhesive film; and a pickup step of expanding the dicing tape after performing the laser processing step to thereby increase the spacing between any adjacent ones of the individual devices, and peeling off to pick up each of the individual devices from the dicing tape in the condition where the adhesive film is mounted on the lower surface of each device.

Preferably, the laser processing step includes the step of incompletely cutting the adhesive film with a part thereof being left. Preferably, the laser processing step includes the step of applying a pulsed laser beam having a wavelength of less than or equal to 370 nm. In the case that the adhesive film is incompletely cut with a part thereof being left in the laser processing step, the pickup step preferably includes the step of expanding the dicing tape in the condition where the adhesive film is cooled to thereby reduce its elasticity.

According to the present invention, in the laser processing step of applying a pulsed laser beam having an absorption wavelength to the wafer along the separation lines after mounting the adhesive film to the dicing tape, thereby separating the wafer into the individual devices and cutting the adhesive film, a cutting unit for cutting a wafer is not used, so that a cutting blade rotating at a high speed does not come into contact with the separated devices. Accordingly, there is no possibility that the separated devices may be vibrated on the adhesive film in the laser processing step. As a result, even when the thickness of the wafer is less than or equal to 100 μm, there is no possibility that the devices may be damaged.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
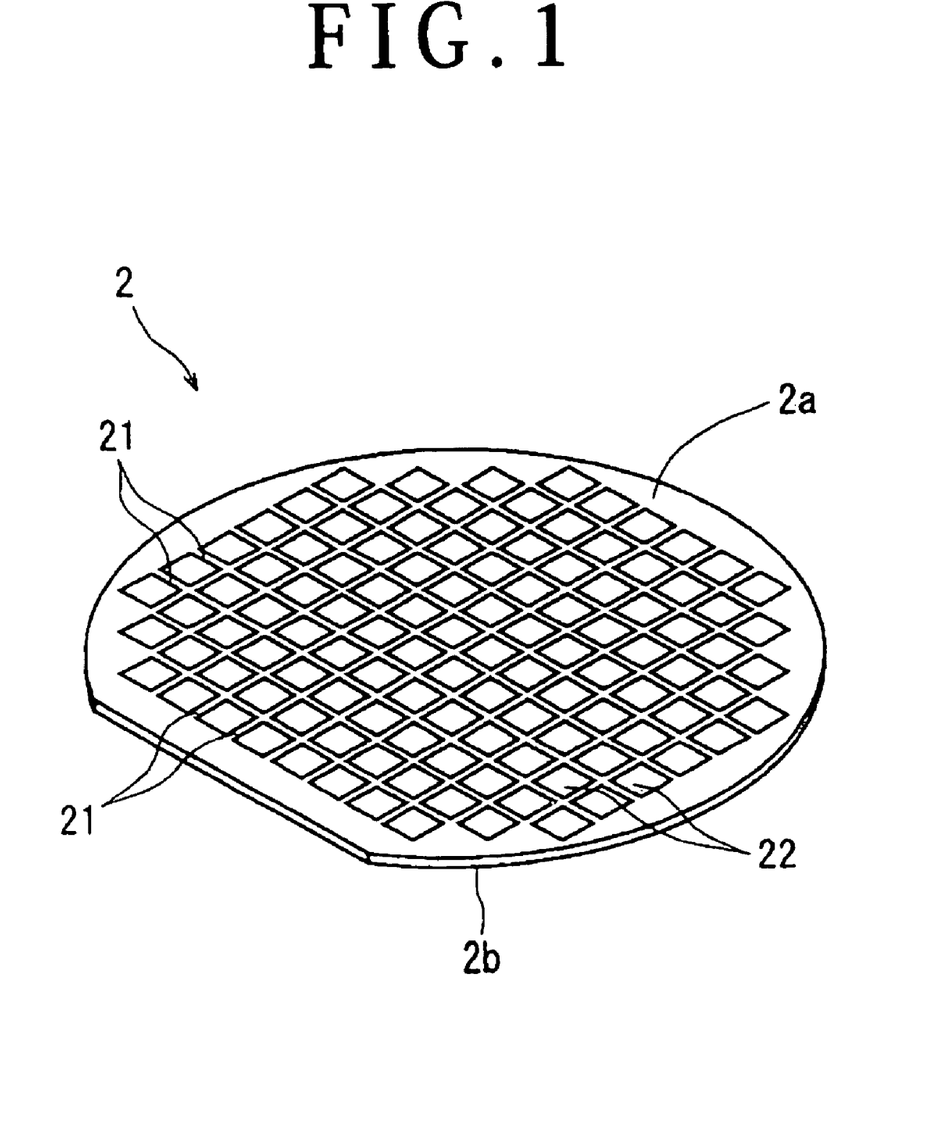
FIG. 1 is a perspective view showing a semiconductor wafer as a wafer.

There will now be described a breaking method for an adhesive film attached to a wafer according to a preferred embodiment of the present invention with reference to the attached drawings. FIG. 1 is a perspective view of a semiconductor wafer 2 as a wafer. The semiconductor wafer 2 shown in FIG. 1 is a silicon wafer having a thickness of 80 μm, for example. The upper surface 2a of the semiconductor wafer 2 is formed with a plurality of crossing separation lines 21 to thereby define a plurality of partitioned regions arranged like a matrix, and a plurality of devices 22 such as ICs and LSIs are formed in these partitioned regions.

Figure 2A:
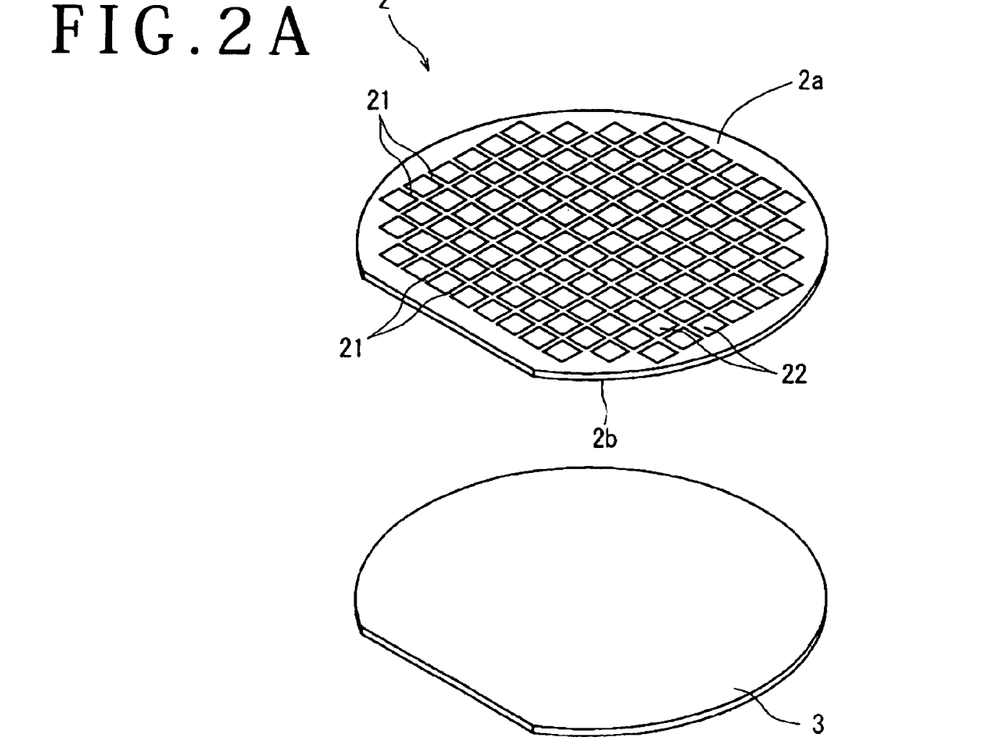
FIGS. 2A and 2B are perspective views illustrating an adhesive film mounting step in the manufacturing method for devices according to the present invention.
Figure 2B:
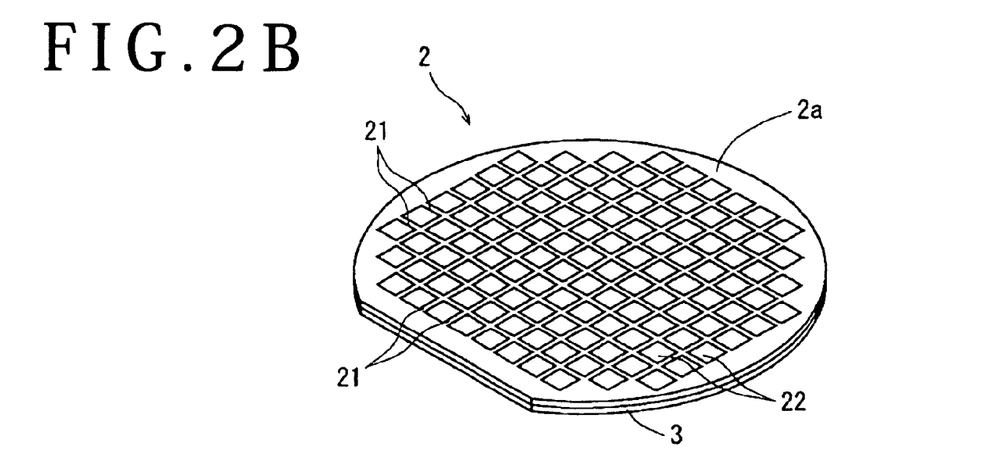

As shown in FIGS. 2A and 2B, an adhesive film 3 for die bonding is mounted to the lower surface 2b of the semiconductor wafer 2 (adhesive film mounting step). In this step, the adhesive film 3 is mounted by heating at a temperature of 80 to 200° C. and pressing the adhesive film 3 against the lower surface 2b of the semiconductor wafer 2. In this preferred embodiment, the adhesive film 3 is formed of epoxy resin and has a thickness of 80 μm.

Figure 3A:
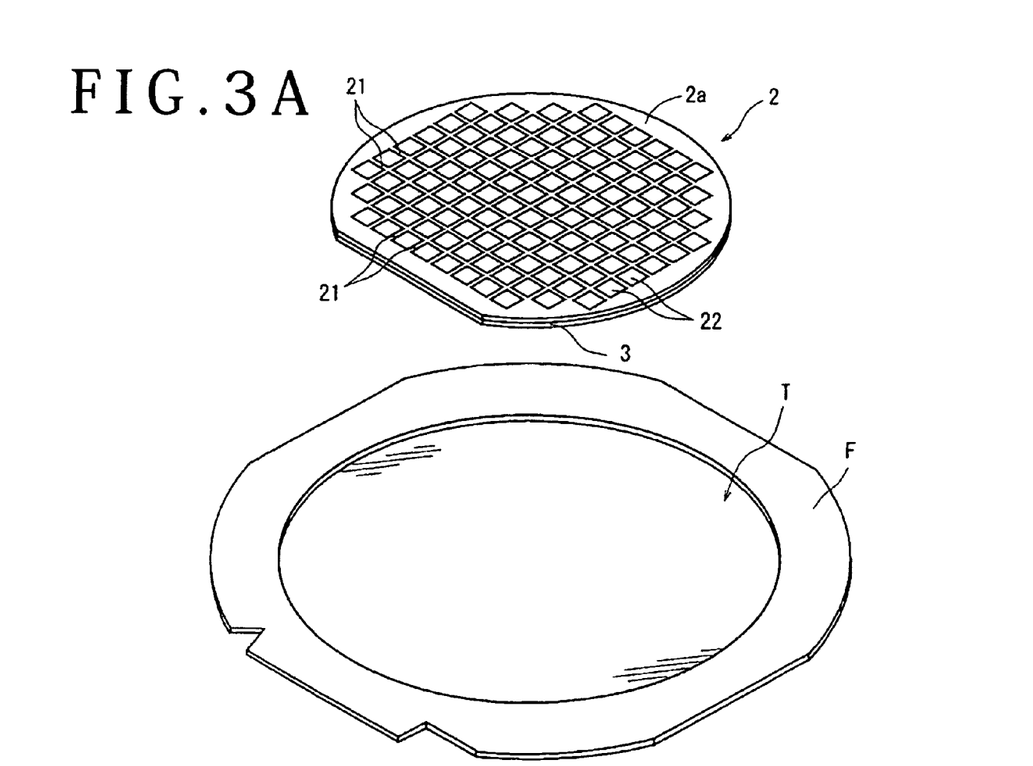
FIGS. 3A and 3B are perspective views illustrating a wafer supporting step in the manufacturing method for devices according to the present invention.
Figure 3B:
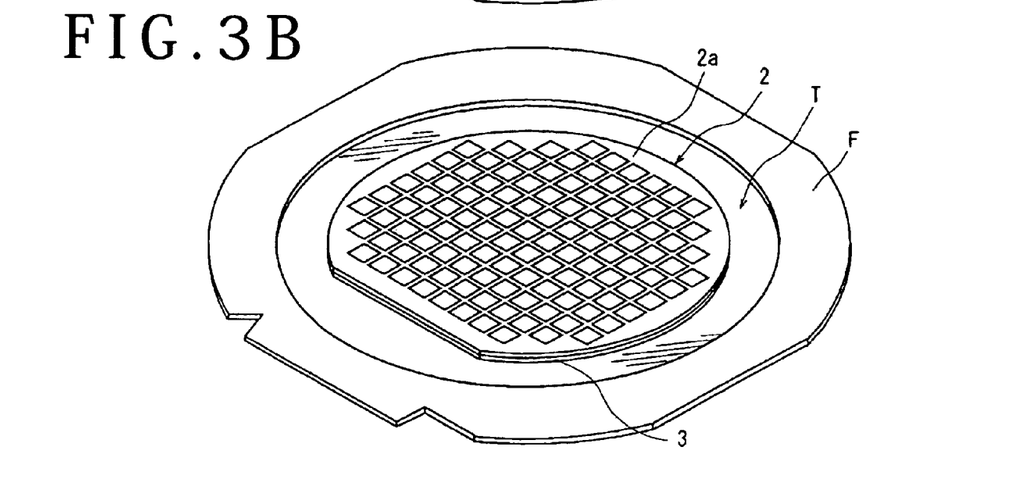

After performing the adhesive film mounting step, the adhesive film 3 mounted to the semiconductor wafer 2 is attached to the upper surface of a dicing tape T as shown in FIGS. 3A and 3B (wafer supporting step). The dicing tape T is preliminarily mounted at its outer circumferential portion to an annular frame F so as to cover the inside opening of the annular frame F. In this preferred embodiment, the dicing tape T is composed of a base sheet having a thickness of 80 μm and an adhesive layer formed on the upper surface of the base sheet and having a thickness of about 5 μm. The base sheet is formed of polyvinyl chloride (PVC), and the adhesive layer is formed of acrylic resin.

Figure 4A:
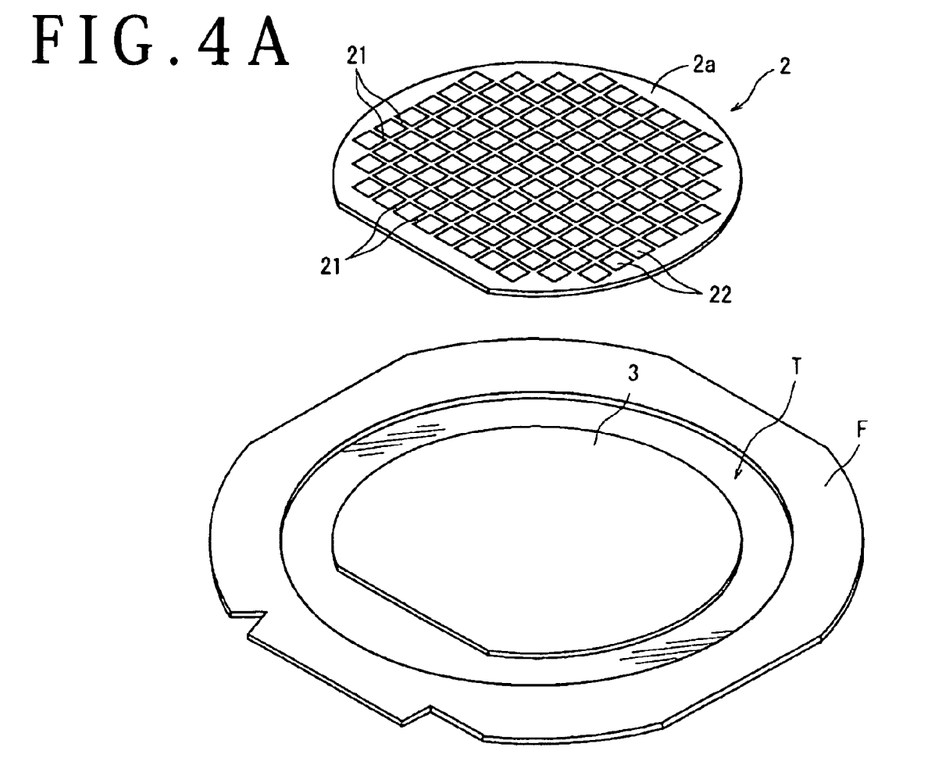
FIGS. 4A and 4B are perspective views illustrating another preferred embodiment of the adhesive film mounting step and the wafer supporting step in the manufacturing method for devices according to the present invention.
Figure 4B:
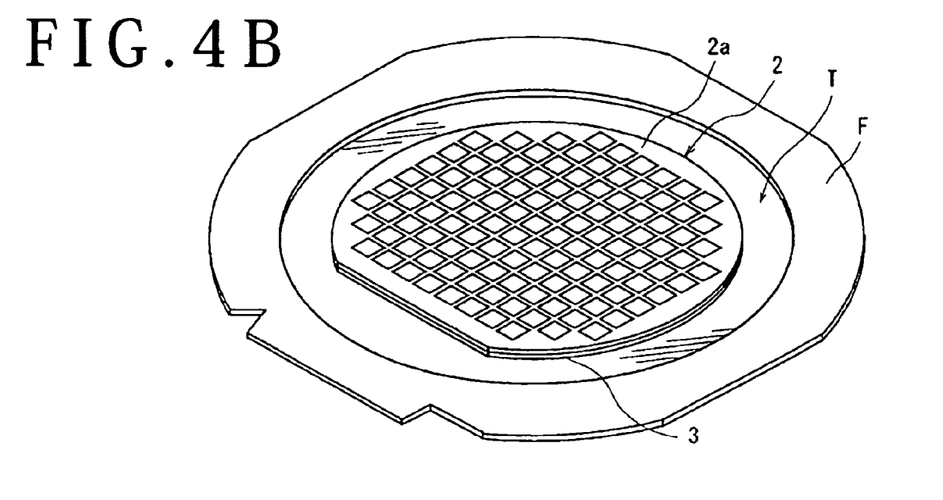

FIGS. 4A and 4B show another preferred embodiment of the adhesive film mounting step and the wafer supporting step. In this preferred embodiment, an adhesive film is preliminarily attached to a dicing tape. As shown in FIGS. 4A and 4B, a dicing tape T is preliminarily mounted at its outer circumferential portion to an annular frame F so as to cover the inside opening of the annular frame F, and an adhesive film 3 is preliminarily attached to the upper surface of the dicing tape T. The adhesive film 3 thus attached to the dicing tape T is mounted to the lower surface 2b of the semiconductor wafer 2. Also in this preferred embodiment, the adhesive film 3 is mounted by heating at a temperature of 80 to 200° C. and pressing the adhesive film 3 against the lower surface 2b of the semiconductor wafer 2. For example, the dicing tape T with the adhesive film 3 may be provided by a dicing tape with an adhesive film (LE5000) manufactured by Lintec Corp.

Figure 5:
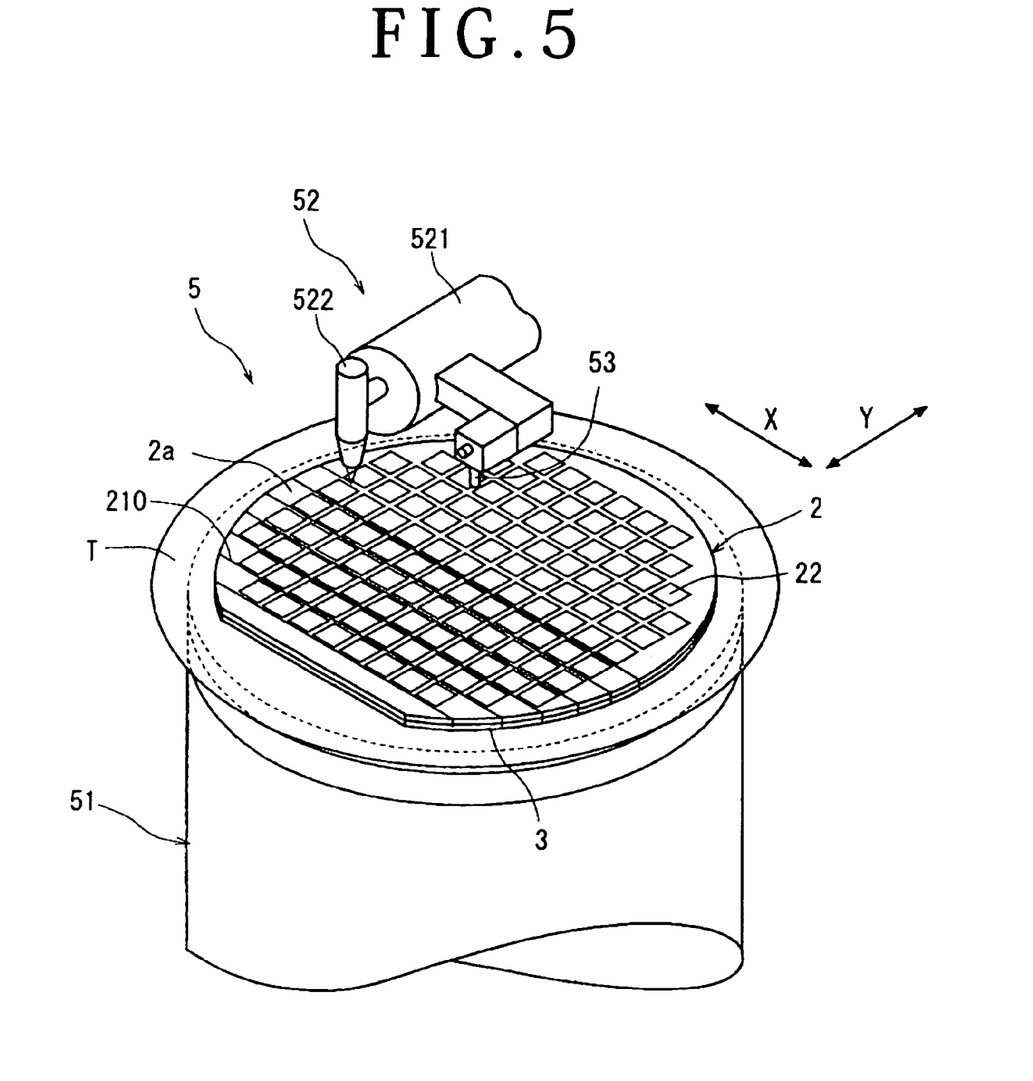
FIG. 5 is a perspective view of an essential part of a laser processing unit for performing a laser processing step in the manufacturing method for devices according to the present invention.

After performing the wafer supporting step, a laser processing step is performed in such a manner that a pulsed laser beam having an absorption wavelength to the wafer is applied to the wafer along the separation lines in the condition where the adhesive film is attached to the dicing tape, thereby separating the wafer into the individual devices and cutting the adhesive film. This laser processing step is performed by using a laser processing unit 5 shown in FIG. 5. As shown in FIG. 5, the laser processing unit 5 includes a chuck table 51 for holding a workpiece, laser beam applying means 52 for applying a laser beam to the workpiece held on the chuck table 51, and imaging means 53 for imaging the workpiece held on the chuck table 51. The chuck table 51 is so configured as to hold the workpiece by using suction means not shown. The chuck table 51 is movable in a work feed direction shown by an arrow X in FIG. 5 and an index direction shown by an arrow Y in FIG. 5 by means of a moving mechanism not shown.

The laser beam applying means 52 includes a cylindrical casing 521 extending in a substantially horizontal direction. Although not shown, the casing 521 contains pulsed laser beam oscillating means including a pulsed laser beam oscillator and repetition frequency setting means. Examples of the pulsed laser beam oscillator include a YAG laser oscillator and a YVO4 laser oscillator. The laser beam applying means 52 further includes focusing means 522 mounted on the front end of the casing 521 for focusing the pulsed laser beam oscillated from the pulsed laser beam oscillating means. The imaging means 53 is provided at the front end portion of the casing 521 of the laser beam applying means 52. The imaging means 53 includes an ordinary imaging device (CCD) and the like for imaging a workpiece by using visible light. An image signal output from the imaging means 53 is transmitted to control means not shown.

The laser processing step using the laser processing unit 5 shown above will now be described with reference to FIGS. 5 to 7, wherein the wafer 2 attached through the adhesive film 3 to the dicing tape T as shown in FIGS. 3A to 4B is separated into the individual devices along the separation lines 21 and the adhesive film 3 is also cut. First, the dicing tape T to which the semiconductor wafer 2 is attached through the adhesive film 3 is placed on the chuck table 51 of the laser processing unit 5 shown in FIG. 5. Thereafter, the suction means not shown is operated to hold the semiconductor wafer 2 through the dicing tape T on the chuck table 51 by vacuum. In FIG. 5, the annular frame F for supporting the dicing tape T is not shown. Although not shown, the annular frame F is supported by suitable frame supporting means provided on the chuck table 51. The chuck table 51 thus holding the semiconductor wafer 2 is moved to a position directly below the imaging means 53 by the moving mechanism not shown.

When the chuck table 51 is positioned directly below the imaging means 53, an alignment operation is performed by the imaging means 53 and the control means not shown to detect a processed area of the semiconductor wafer 2 to be laser-processed. More specifically, the imaging means 53 and the control means (not shown) perform image processing such as pattern matching for making the alignment of the separation lines 21 extending in a predetermined direction on the semiconductor wafer 2 and the focusing means 522 of the laser beam applying means 52 for applying the laser beam to the semiconductor wafer 2 along the separation lines 21, thus performing the alignment of a laser beam applying position (alignment step). Similarly, the alignment of a laser beam applying position is performed for the other separation lines 21 extending in a direction perpendicular to the above-mentioned predetermined direction on the semiconductor wafer 2.

Figure 6:
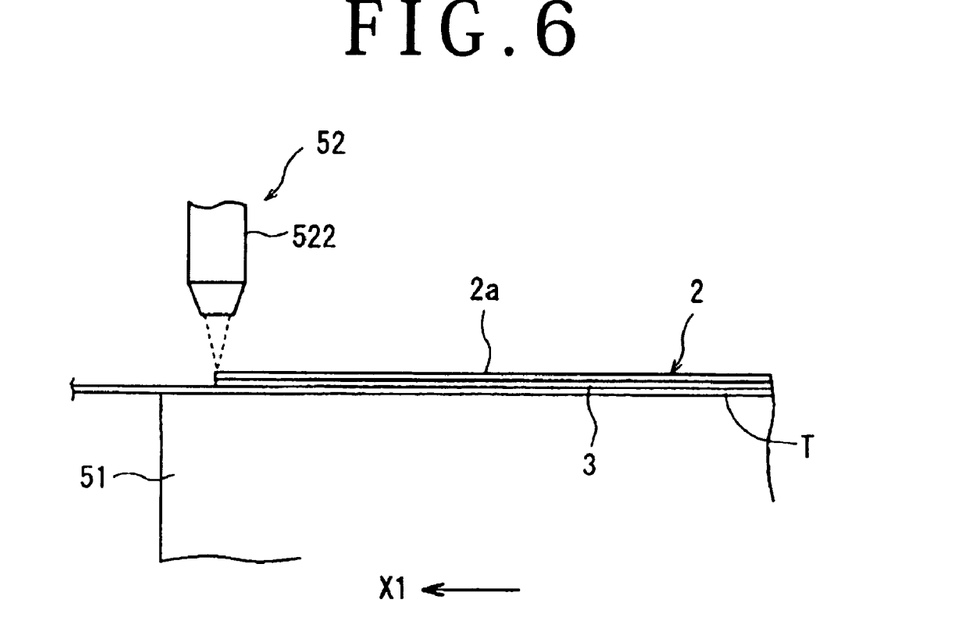
FIG. 6 is a schematic side view illustrating the laser processing step in the manufacturing method for devices according to the present invention using the laser processing unit shown in FIG. 5.
Figure 7:
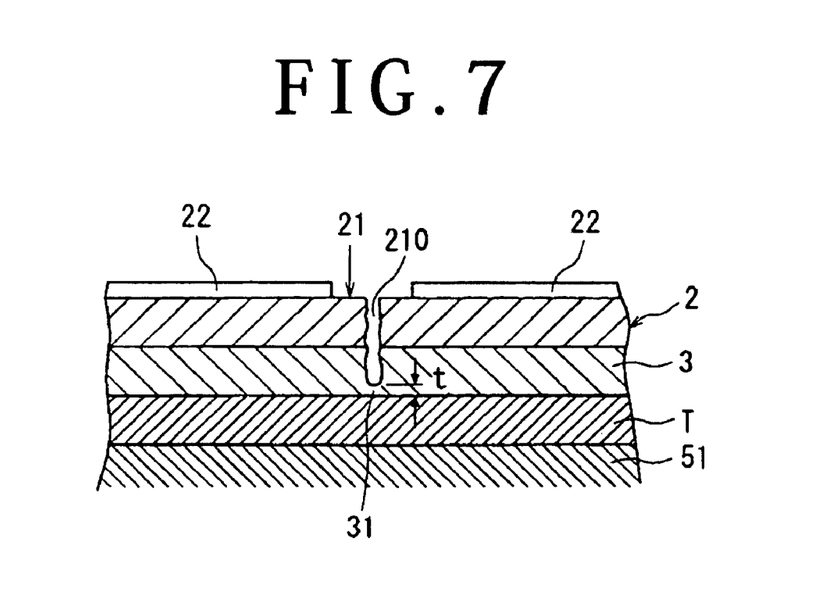
FIG. 7 is an enlarged sectional view of the semiconductor wafer processed by the laser processing step shown in FIG. 6.

After detecting the separation lines 21 of the semiconductor wafer 2 held on the chuck table 51 to perform the alignment of a laser beam applying position as mentioned above, the chuck table 51 is moved to a laser beam applying area where the focusing means or condenser 522 of the laser beam applying means 52 is located as shown in FIG. 6, thereby positioning one end (left end as viewed in FIG. 6) of a predetermined one of the separation lines 21 directly below the focusing means 522 of the laser beam applying means 52. In this condition, a pulsed laser beam having an absorption wavelength to a silicon wafer is applied from the focusing means 522 along the predetermined separation line 21, and the chuck table 51 is moved in a direction shown by an arrow X1 in FIG. 6 at a predetermined feed speed (laser processing step). When the laser beam applying position of the focusing means 522 of the laser beam applying means 52 reaches the other end (right end as viewed in FIG. 6) of the predetermined separation line 21, the application of the pulsed laser beam is stopped, and the movement of the chuck table 51 is also stopped. As the pulsed laser beam having an absorption wavelength to a silicon wafer, a pulsed laser beam having a wavelength of less than or equal to 370 nm in the ultraviolet wavelength region is preferable. In particular, a pulsed laser beam having a wavelength of 266 nm is well absorptive for efficient cutting of the silicon wafer 2 and the adhesive film 3.

For example, the laser processing step mentioned above is performed under the following processing conditions.

Light source of laser beam: YVO4 laser or YAG laser
Wavelength: 266 nm
Repetition frequency: 50 kHz
Average power: 4 W
Focused spot: Elliptical shape (major axis: 200 μm, minor axis: 10 μm)
Work feed speed: 150 mm/sec By one cycle of the laser processing step under the above processing conditions, a laser processed groove having a depth of about 40 μm is formed in the semiconductor wafer 2. Accordingly, by repeating the laser processing step twice, the semiconductor wafer 2 in this preferred embodiment can be cut to be separated. Further, by performing one additional cycle of the laser processing step, a laser processed groove having a depth of about 70 μm can be formed in the adhesive film 3. As a result, as shown in FIG. 7, a laser processed groove 210 is formed in the whole of the semiconductor wafer 2 and the adhesive film 3 along the predetermined separation line 21, so that the semiconductor wafer 2 is separated into the individual devices 22 by the laser processed groove 210, and the adhesive film 3 is incompletely cut with a part 31 thereof being left. In this preferred embodiment, the remaining part 31 has a thickness t of 10 μm. The thickness t of the remaining part 31 is preferably set to less than or equal to 20 μm.

Thus, the adhesive film 3 is incompletely cut by the laser beam in the condition where the remaining part 31 is left. Accordingly, there is no possibility that the adhesive film 3 may be fused to adhere to the dicing tape T. Alternatively, the adhesive film 3 may be completely cut in the laser processing step. As described above, the laser processing step does not use a cutting unit for cutting a wafer, so that a cutting blade rotating at a high speed does not come into contact with the separated devices 22. Accordingly, there is no possibility that the separated devices 22 may be vibrated on the adhesive film 3 in the laser processing step. As a result, even when the thickness of the semiconductor wafer 2 is less than or equal to 100 μm, there is no possibility that the devices 22 may be damaged. The laser processing step mentioned above is performed along all of the separation lines 21 formed on the semiconductor wafer 2.

Figure 8:
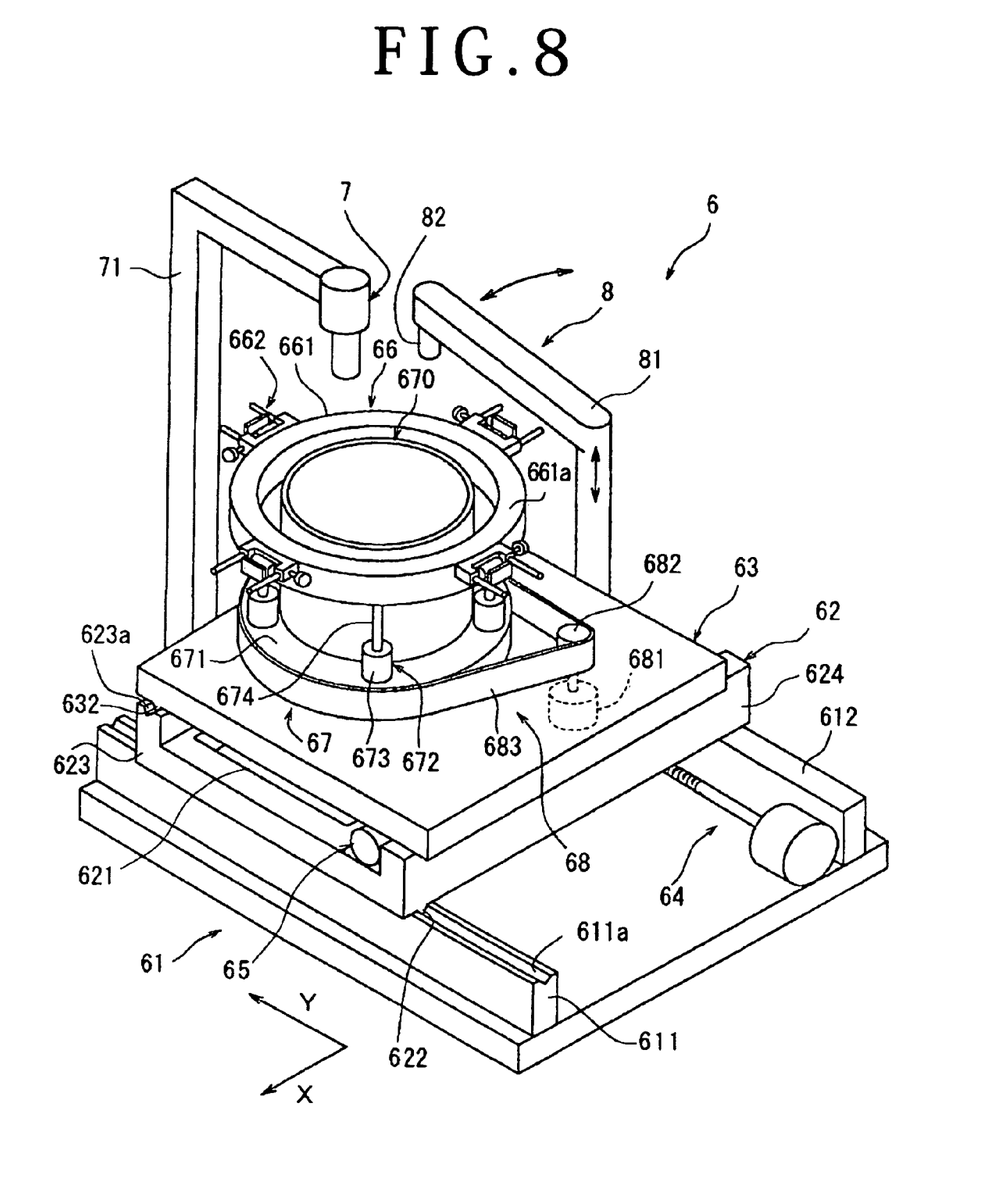
FIG. 8 is a perspective view of a pickup unit for performing a pickup step in the manufacturing method for devices according to the present invention.

After performing the laser processing step, a pickup step is performed in such a manner that the dicing tape is expanded to increase the spacing between the adjacent separated devices and each device with the adhesive film attached to the lower surface thereof is peeled off from the dicing tape. This pickup step is performed by using a pickup unit 6 shown in FIG. 8. As shown in FIG. 8, the pickup unit 6 includes a base 61, a first table 62 provided on the base 61 so as to be movable in a direction shown by an arrow Y in FIG. 6, and a second table 63 provided on the first table 62 so as to be movable in a direction shown by an arrow X in FIG. 6, the direction of the arrow X being perpendicular to the direction of the arrow Y. The base 61 has a rectangular shape, and two guide rails 611 and 612 are provided on the upper surface of the base 61 at opposite side portions thereof so as to extend parallel to each other in the direction of the arrow Y. A guide groove 611a having a V-shaped cross section is formed on the upper surface of only the guide rail 611.

The first table 62 has a rectangular framelike shape having a central rectangular opening 621. A guided rail 622 is formed on the lower surface of the first table 62 at one side portion thereof so as to be slidably fitted with the guide groove 611a of the guide rail 611 provided on the base 61. Two guide rails 623 and 624 are provided on the upper surface of the first table 62 at opposite side portions thereof so as to extend parallel to each other in the direction perpendicular to the direction of extension of the guided rail 622. A guide groove 623a having a V-shaped cross section is formed on the upper surface of only the guide rail 623. The first table 62 is supported to the base 61 in such a manner that the guided rail 622 is slidably fitted with the guide groove 611a of the guide rail 611 provided on the base 61 and that the lower surface of the other side portion of the first table 61 is slidably mounted on the other guide rail 612 provided on the base 61. The pickup unit 6 further includes first moving means 64 for moving the first table 62 along the guide rails 611 and 612 provided on the base 61 in the direction of the arrow Y.

The second table 63 has a rectangular shape, and a guided rail 632 is formed on the lower surface of the second table 63 at one side portion thereof so as to be slidably fitted with the guide groove 623a of the guide rail 623 provided on the first table 62. The second table 63 is supported to the first table 62 in such a manner that the guided rail 632 is slidably fitted with the guide groove 623a of the guide rail 623 provided on the first table 62 and that the lower surface of the other side portion of the second table 63 is slidably mounted on the other guide rail 624 provided on the first table 62. The pickup unit 6 further includes second moving means 65 for moving the second table 63 along the guide rails 623 and 624 provided on the first table 62 in the direction of the arrow X.

The pickup unit 6 further includes frame holding means 66 for holding the annular frame F and tape expanding means 67 for expanding the dicing tape T mounted on the annular frame F held by the frame holding means 66. The frame holding means 66 includes an annular frame holding member 661 and a plurality of clamps 662 as fixing means provided on the outer circumference of the frame holding member 611. The upper surface of the frame holding member 661 functions as a mounting surface 661a for mounting the annular frame F thereon. The annular frame F mounted on the mounting surface 661a is fixed to the frame holding member 661 by the clamps 662. The frame holding means 66 is provided above the second table 63 and supported by the tape expanding means 67 so as to be vertically movable.

Figure 9A:
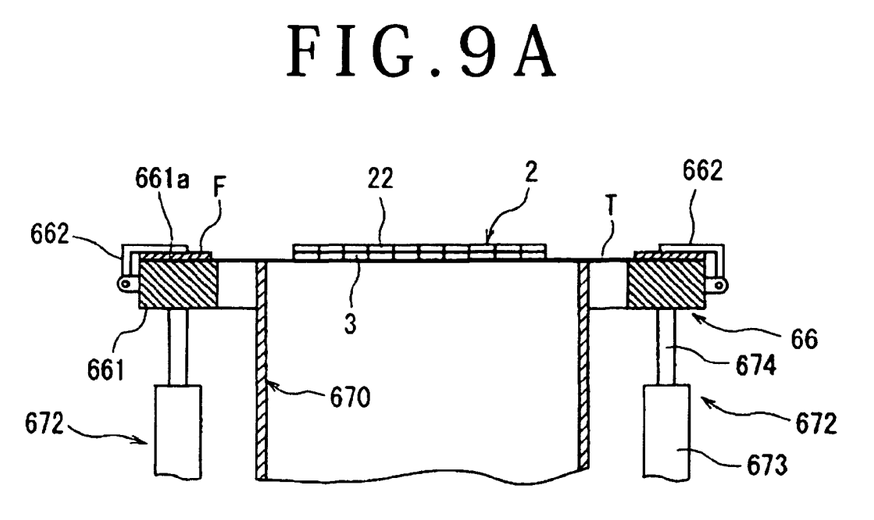
FIGS. 9A and 9B are sectional side views illustrating a tape expanding step in the pickup step in the manufacturing method for devices according to the present invention.
Figure 9B:
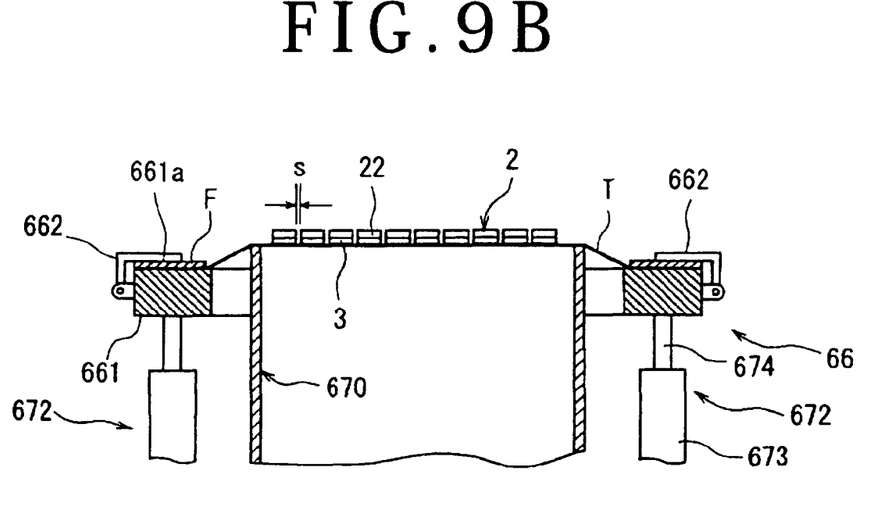

The tape expanding means 67 includes an expanding drum 670 provided inside of the annular frame holding member 661. The expanding drum 670 has an outer diameter smaller than the inner diameter of the annular frame F and an inner diameter larger than the outer diameter of the semiconductor wafer 2 attached to the dicing tape T mounted on the annular frame F. The expanding drum 670 includes a fitting portion at a lower end portion rotatably fitted with a hole (not shown)

formed through the second table 63. Further, a supporting flange 671 is formed above the fitting portion so as to project radially outward from the cylindrical surface of the expanding drum 670. The tape expanding means 67 shown in the figure of the embodiment further includes supporting means 672 for vertically movably supporting the annular frame holding member 661. The supporting means 672 is composed of a plurality of air cylinders 673 provided on the supporting flange 671. Each air cylinder 673 is provided with a piston rod 674 connected to the lower surface of the annular frame holding member 661. The supporting means 672 composed of the plural air cylinders 673 functions to move the annular frame holding member 661 so as to selectively take a reference position where the mounting surface 661a is substantially equal in height to the upper end of the expanding drum 670 as shown in FIGS. 8 and 9A and an expansion position where the mounting surface 661a is lower in height than the upper end of the expanding drum 670 by a predetermined amount as shown in FIG. 9B.

As shown in FIG. 8, the pickup unit 6 according to the embodiment shown in the figure further includes rotating means 68 for rotating the expanding drum 670 and the frame holding member 661. The rotating means 68 includes a pulse motor 681 provided on the second table 63, a pulley 682 mounted on the rotating shaft of the pulse motor 681, and an endless belt 683 wrapped between the pulley 682 and the supporting flange 671 of the expanding drum 670. The rotating means 68 functions in such a manner that the pulse motor 681 is driven to rotate the expanding drum 670 through the pulley 682 and the endless belt 683.

The pickup unit 6 according to the embodiment shown in the figure further includes detecting means 7 for detecting the individual separated devices 22 of the semiconductor wafer 2 supported through the dicing tape T to the annular frame F held to the annular frame holding member 661. The detecting means 7 is supported to an L-shaped support column 71 provided on the base 61. Although not shown, the detecting means 7 includes an optical system and an imaging device (CCD) and the like to image each of the individual separated devices 22 of the semiconductor wafer 2 supported through the dicing tape T to the annular frame F held to the annular frame holding member 661. An image signal output as an electrical signal from the detecting means 7 is transmitted to the control means.

The pickup unit 6 according to the embodiment shown in the figure further includes pickup means 8 for picking up the individual separated devices 22 from the dicing tape T. The pickup means 8 includes a swing arm 81 provided on the base 61 and a pickup collet 82 mounted at the front end of the swing arm 81. The swing arm 81 is horizontally swung by driving means not shown. Further, the swing arm 81 is vertically movable, so that the pickup collet 82 mounted at the front end of the swing arm 81 can pick up each of the individual separated devices 22 attached to the dicing tape T.

Figure 10:
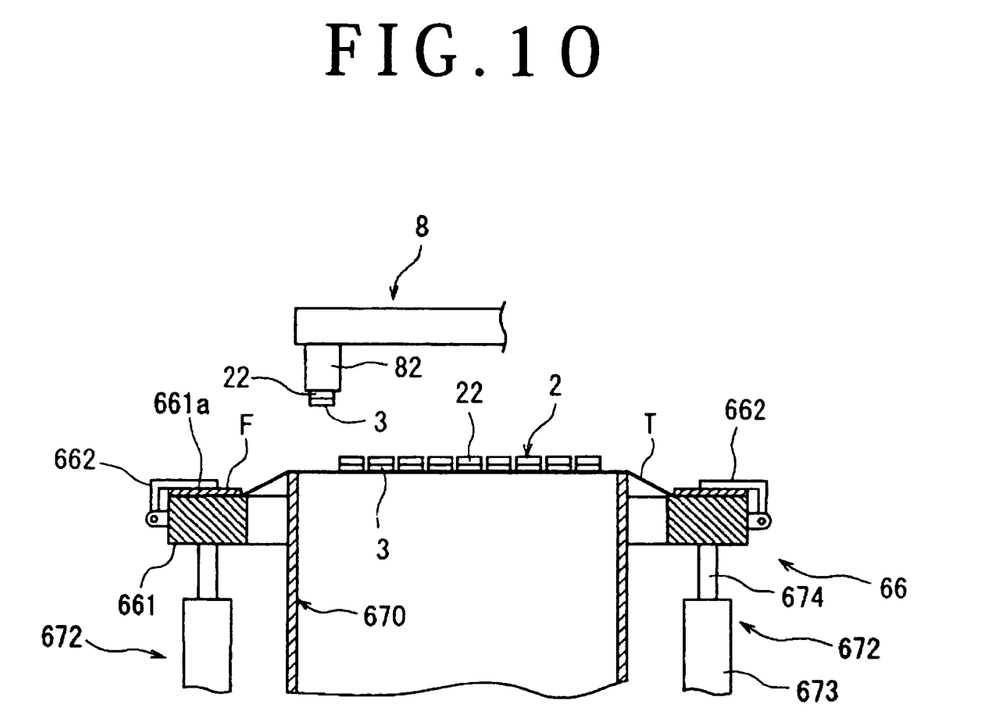
FIG. 10 is a sectional side view illustrating a pickup step in the manufacturing method for devices according to the present invention.

The pickup unit 6 according to the embodiment shown in the figure is composed as described above, and the pickup step to be performed by the pickup unit 6 will now be described with reference to FIGS. 9A to 10. After performing the laser processing step described above, the annular frame F supporting the individual devices 22 through the dicing tape T in the condition where the adhesive film 3 is attached to the lower surface of each device 22 is mounted on the mounting surface 661a of the frame holding member 661 of the frame holding means 66 and fixed to the frame holding member 661 by the clamps 662 as shown in FIG. 9A (frame holding step). At this time, the frame holding member 661 is set at the reference position shown in FIG. 9A.

After fixing the annular frame F supporting the individual devices 22 through the dicing tape T in the condition where the adhesive film 3 is attached to the lower surface of each device 22 to the frame holding member 661 set at the reference position as shown in FIG. 9A, the plural air cylinders 673 as the supporting means 672 of the tape expanding means 67 are operated to thereby lower the annular frame holding member 661 to the expansion position shown in FIG. 9B. Accordingly, the annular frame F fixed to the mounting surface 661a of the frame holding member 661 is also lowered, so that the dicing tape T mounted on the annular frame F comes into pressure contact with the upper end of the expanding drum 670 and is expanded under tension as shown in FIG. 9B (tape expanding step). As a result, a tensile force is radially applied to the adhesive film 3 attached to the dicing tape T. In the case that the adhesive film 3 is incompletely cut along the individual devices 22 in the laser processing step, the adhesive film 3 is completely cut along the individual devices 22 in the tape expanding step. At the same time, the spacing S between the adjacent individual devices 22 is increased in the condition where the adhesive film 3 completely cut above is attached to the lower surface of each device 22.

In the case that the adhesive film 3 is incompletely cut in the condition where the thickness of the remaining part 31 is less than or equal to 20 μm, the adhesive film 3 can be easily broken along the outer periphery of each device 22 in the tape expanding step. Further, in the case that the adhesive film 3 is incompletely cut, the moving speed of the annular frame holding member 611 in the tape expanding step is preferably set to 50 mm/sec or more. Further, in the case that the adhesive film 3 is incompletely cut, the adhesive film 3 is preferably cooled to 10° C. or less to thereby reduce its stretchability in the tape expanding step.

After performing the tape expanding step mentioned above, the first moving means 64 and the second moving means 65 are operated to thereby move the first table 62 in the direction of the arrow Y (see FIG. 8) and to also move the second table 63 in the direction of the arrow X (see FIG. 8), thereby positioning each of the individual devices 22 directly below the detecting means 7, wherein each device 22 is attached through the adhesive film 3 to the dicing tape T mounted on the annular frame F held to the frame holding member 661. The detecting means 7 is operated to check whether or not the direction of extension of the spacing between the adjacent individual devices 22 coincides with the direction of the arrow Y or the direction of the arrow X. If the direction of extension of the spacing between the adjacent individual devices 22 does not coincide with the direction of the arrow Y or the direction of the arrow X, the rotating means 68 is operated to thereby rotate the frame holding means 66, thereby making the direction of extension of the spacing between the adjacent individual devices 22 coincide with the direction of the arrow Y or the direction of the arrow X.

Thereafter, the pickup means 8 is operated as moving the first table 62 in the direction of the arrow Y and moving the second table 63 in the direction of the arrow X to thereby make the pickup collet 82 chuck each device 22 (the adhesive film 3 being attached to the lower surface thereof) located at the predetermined position, then peeling off each device 22 from the dicing tape T (pickup step). Each device 22 thus picked up by the pickup means 8 is transported to a tray not shown or subjected to a die bonding step. In this pickup step, each device 22 can be easily picked up without the contact with any other device adjacent thereto because the spacing S between the adjacent individual devices 22 each having the adhesive film 3 has been increased in the tape expanding step. Accordingly, even when the thickness of each device 22 is less than or equal to 100 μm, each device 22 can be reliably picked up without any damage due to contact.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method for devices formed in a plurality of partitioned regions defined by a plurality of crossing separation lines formed on the upper surface of a wafer having a thickness of less than or equal to 100 μm, wherein said wafer is being separated into said individual devices along said separation lines, said manufacturing method comprising:

a wafer supporting step of mounting an adhesive film for die bonding to the lower surface of said wafer and attaching said wafer through said adhesive film to the upper surface of a dicing tape mounted on an annular frame;

a laser processing step of applying a pulsed laser beam having an absorption wavelength to said wafer along said separation lines of said wafer after mounting said adhesive film to the dicing tape, separating said wafer into said individual devices and cutting said adhesive film; and a pickup step of expanding said dicing tape after performing said laser processing step to increase the spacing between any adjacent ones of said individual devices, and peeling off to pick up each of said individual devices from said dicing tape in the condition where said adhesive film is mounted on the lower surface of each device, wherein said laser processing step comprises the step of incompletely cutting said adhesive film with a part being left, and wherein said adhesive tape which is incompletely cut in said laser processing step is completely cut by expanding said dicing tape.

2. The manufacturing method for devices according to claim 1, wherein said laser processing step comprises the step of applying a pulsed laser beam having a wavelength of less than or equal to 370 nm.

3. The manufacturing method for devices according to claim 1, wherein said pickup step comprises the step of expanding said dicing tape in the condition where said adhesive film is cooled to reduce its elasticity.

4. The manufacturing method for devices according to claim 1, wherein said pickup step includes the use of a drum member seated within a frame holding member, whereby an outer periphery of the dicing tape is affixed to the frame holding member, and further wherein said frame holding member is moved relative to said drum member to expand said dicing tape.

5. The manufacturing method for devices according to claim 1, wherein said laser processing step is performed three times, with a first cycle of the laser processing step incompletely cutting said wafer, a second cycle of the laser processing step completely cutting through said wafer, and a third cycle performing the step of incompletely cutting said adhesive film.

* * * * *